United States Patent
Yamada et al.

(10) Patent No.: US 8,961,717 B2
(45) Date of Patent: Feb. 24, 2015

(54) STAINLESS STEEL FOIL FOR FLEXIBLE DISPLAY USE

(71) Applicant: Nippon Steel Materials Co, Ltd., Tokyo (JP)

(72) Inventors: Noriko Yamada, Tokyo (JP); Toyoshi Ogura, Tokyo (JP); Yuji Kubo, Tokyo (JP); Shuji Nagasaki, Tokyo (JP)

(73) Assignee: Nippon Steel & Sumikin Materials Co., Ltd., Tokyo (JP)

( * ) Notice: Subject to any disclaimer, the term of this patent is extended or adjusted under 35 U.S.C. 154(b) by 0 days.

(21) Appl. No.: 14/193,042

(22) Filed: Feb. 28, 2014

(65) Prior Publication Data

US 2014/0173860 A1 Jun. 26, 2014

Related U.S. Application Data

(63) Continuation of application No. 12/736,829, filed as application No. PCT/JP2009/059236 on May 13, 2009.

(30) Foreign Application Priority Data

May 16, 2008 (JP) ................. 2008-130016

(51) Int. Cl.
| | |
|---|---|
| *C22C 38/00* | (2006.01) |
| *B21B 1/40* | (2006.01) |
| *C21D 6/00* | (2006.01) |
| *C21D 8/04* | (2006.01) |
| *H01L 51/00* | (2006.01) |
| *C21D 9/46* | (2006.01) |

(52) U.S. Cl.
CPC . *B21B 1/40* (2013.01); *C21D 6/002* (2013.01); *C21D 8/0426* (2013.01); *C21D 8/0463* (2013.01); *C22C 38/00* (2013.01); *H01L 51/0097* (2013.01); *C21D 9/46* (2013.01); *C21D 2211/005* (2013.01); *Y02E 10/549* (2013.01)

USPC ............ 148/610; 148/325; 428/687; 29/17.2

(58) Field of Classification Search
USPC ........................................................ 148/610
See application file for complete search history.

(56) References Cited

FOREIGN PATENT DOCUMENTS

| | | |
|---|---|---|
| CN | 101244428 | 8/2008 |
| JP | 06212364 | 8/1994 |
| JP | 9-179106 | 7/1997 |
| JP | 2003-185813 | 7/2003 |
| JP | 2003-247078 | 9/2003 |
| JP | 2004-335853 | 11/2004 |

OTHER PUBLICATIONS

International Search Report dated Jun. 30, 2009 issued in corresponding PCT Application No. PCT/JP2009/059236.

(Continued)

*Primary Examiner* — Jessee Roe
*Assistant Examiner* — Christopher Kessler
(74) *Attorney, Agent, or Firm* — Kenyon & Kenyon LLP

(57) ABSTRACT

The present invention provides stainless steel foil for flexible display use which enables fabrication of a TFT substrate for display use which is superior in shape recovery after being rolled up or bent and which is high in surface flatness and is characterized by having a thickness of 20 μm to 200 μm, a surface roughness Ra of 50 nm or less, and a shape recovery of a distortion angle of 10° or less after being wound around a 30 mm diameter cylinder.

5 Claims, 2 Drawing Sheets

(56) References Cited

OTHER PUBLICATIONS

I-Chung et al., "High Electron Mobility TFTs of Nanocrystalline Silicon Deposited at 150° C. on Plastic Foil" *Mat. Res. Soc. Symp. Proc.*, 664, (2001), A26.1.1-A26.1.6.

W. A. MacDonald et al., "P-50: The Impact of Thermal Stress, Mechanical Stress and Environment on Dimensional Reproducibility of Polyester Film During Flexible Electronics Processing" *SID 07 Digest*, (2007), p. 373-376.

M. Wu and S. Wagner, "P-channel Polycrystalline Silicon Thin Film Transistors on Steel Foil Substrates" *Mat. Res. Soc. Symp. Proc.*, 664, (2001), A17.2-A17.2.4.

J. Chen et al., "65.2: Spin-on Polymers for TFT Gate Dielectric Application and Planarization of Stainless Steel" *SID 06 Digest*, (2006), p. 1878-1881.

S.-H. Paek et al., "62.3:10.1 inch SVGA Ultra Thin and Flexible Active Matric Electophoretic Display" *SID 06 Digest*, (2006), p. 1834-1837.

Machine translation of JP 09-179106 (Japanese document published Nov. 7, 1997).

Machine translation of JP 2003-185813 (Japanese document published Mar. 7, 2003).

Machine translation of JP 2004-335853 (Japanese document published Nov. 25, 2004).

Office Action dated Sep. 26, 2014 issued in related Chinese Application No. 201310611706.7.

| | 430H MATERIAL | 430BA MATERIAL |
|---|---|---|
| SURFACE OF SUS (STAINLESS STEEL) FOIL AFTER FORMATION OF INSULATING FILM |  |  |
| SURFACE OF SUS (STAINLESS STEEL) FOIL |  |  |

STAINLESS STEEL FOIL FOR FLEXIBLE DISPLAY USE

This application is a continuation application of U.S. application Ser. No. 12/736,829, filed Nov. 10, 2010, a national stage application of International Application No. PCT/JP2009/059236, filed May 13, 2009, which claims priority to Japanese Application No. 2008-130016, filed May 16, 2008, each of which is incorporated by reference in its entirety.

TECHNICAL FIELD

The present invention relates to stainless steel foil for flexible display use used for a TFT substrate used for electronic paper, an organic EL display, or other flexible display.

BACKGROUND ART

As a new field of displays, electronic books, PNDs (personal navigation devices), PDAs (personal digital assistants), and other types of display devices carried by individuals are becoming more popular. Further, display devices like electronic newspapers using electronic paper which can be read by the same feeling as with conventional printed paper are being developed. Organic EL (electroluminescence) displays and display panels using electronic paper are recently particularly coming under the spotlight. These displays have to mount drive use TFTs (thin film transistors) in order to achieve high performance display. The current mainstream of TFTs are Si-based semiconductor materials. These are usually subjected to process temperatures of 300 to 450° C. due to annealing etc. The TFTs are therefore fabricated on glass substrates.

In recent years, for popularizing the new portable display terminals and electronic paper, displays which, unlike conventional displays, are thin, light, and flexible like paper are being sought. Safety, i.e., not breaking even if dropped, is also being sought. With conventional glass substrates, these demands cannot be met. Therefore, display substrates using organic plastic films or metal foil are being developed.

For example, electronic paper is produced by combining electronic ink comprised of 50 to 70 μm diameter microcapsules in which charged black and white particles are sealed, that is, "E Ink", and 0.1 to 0.2 mm or so thickness TFT substrates. A front substrate formed by thin transparent plastic film is coated with transparent electrodes and microcapsules in which black and white particles are sealed. A back substrate is formed with switches for applying voltage comprised of TFT circuits. Due to the black and white particles in the microcapsules, by applying voltage between the transparent electrodes at the front substrate and the electrodes at the back substrate, the capsules gather at one, thereby enabling black and white display. For the front substrate, a plastic film can be used, but the back substrate for forming the TFTs requires heat resistance, chemical resistance, etc., so selection of the substrate material is difficult.

An organic plastic film is light in weight, superior in flexibility, and diverse in type. However, in applications for TFT substrates for display use, chemical stability, heat resistance, moisture resistance, etc. sufficient to withstand the TFT fabrication process are demanded, so the resins which can be used are limited. Polyimides, PES, PEN, etc. are being studied [see NPLTs 1, 2], but there are no plastic films able to be widely used in 350° C. or more processes giving good TFT characteristics.

In metal foil, stainless steel foil superior in heat resistance and corrosion resistance is being studied as a TFT substrate and prototype displays are being made [see NPLTs 3 to 5]. Metal foil is conductive, so when using it as a display substrate instead of a glass substrate, it is necessary to form an insulating film on its surface. Attempts are being made to use insulated stainless steel foil as a substrate for fabricating TFTs [see PLT 1].

The resolution of display elements of electronic paper etc. is governed by the precision of fabrication of the TFTs, so in general there is an extremely strong demand for surface smoothness of glass substrates for display use. For example, specifications demand an Ra of 15 μm square region observed by an atomic force microscope (AFM) of 5 nm or less. For an insulated stainless steel foil as well, the surface of the insulating film is required to have a high smoothness. The thickness of the insulating film is usually around 2 μm, so the smoothness of the surface of the stainless steel foil itself also has an effect on the smoothness of the surface of the insulating film. Therefore, as a method for flattening the surface of stainless steel foil, after foil rolling, bright annealing is performed to give the surface a mirror finish. A bright annealed material is called a "BA material" and is superior in flatness to a hard (H) material which is not bright annealed. FIG. 1 gives scan electron microscope (SEM) photographs of the surfaces of an H material and BA material of SUS430 and SEM photographs of the surfaces of the insulating films after forming insulating films on the same to a thickness of 1.5 μm. The H material of SUS430 exhibits noticeable stripes parallel to the rolling direction called "ridging". Even if forming a 1.5 μm insulating film, these stripes remain as clear from the photographs. The Ra's measured by a stylus type surface roughness meter were 61 nm and 15 nm for the H and BA treated surfaces of stainless steel foil, while the roughnesses Ra of the surfaces of the insulating films were 28 nm and 11 nm. A BA material is higher in flatness than an H material. The smoothness of the insulating film formed on it is also superior, it is learned.

However, stainless steel foil of a bright annealed BA material, while also depending on the thickness, has the problem of a poor shape recovery. When rolling up foil of a thickness of about 150 μm to a tube of a size of a diameter of about 50 mm able to be held by one hand, the foil will not return to a flat surface even after the rolling force is removed. If trying to forcibly return its shape, an uneven surface results. A BA material is believed to be poor in shape recovery due to the removal of strain and softening during annealing. For a flexible display substrate, whether the original shape is returned to after rolling is important. Unless able to be spread flat and viewed after being rolled up, use as a display is difficult. Therefore, a TFT back substrate for flexible display use is required to have shape recovery after being rolled up, but up to now no method for achieving both surface smoothness and shape recovery has been discovered.

CITATION LIST

Patent Literature

PLT 1: Japanese Patent Publication (A) No. 2003-247078

Non-Patent Literature

NPLT 1: I-Chung et al., *Mat. Res. Soc. Symp. Proc.*, 664, A26.1 (2001)

NPLT 2: W. A. MacDonald et al., *SID 07 Digest*, p. 373 (2007)

NPLT 3: M. Wu and S. Wagner, *Mat. Res. Soc. Symp. Proc.*, 664, A17.2 (2001)

NPLT 4: J. Chen et al., *SID 06 Digest*, p. 1878 (2006)
NPLT 5: S.-H. Paek et al., *SID 06 Digest*, p. 1834 (2006)

SUMMARY OF INVENTION

Technical Problem

The present invention has as its object the provision of stainless steel foil for flexible display use which enables fabrication of a TFT substrate for display use which is superior in shape recovery after being rolled up or bent and which is high in surface smoothness.

Solution to Problem

The present invention was made to solve the above problem and has as its gist the following:
(1) Stainless steel foil for flexible display use characterized by having a thickness of 20 μm to 200 μm, a surface roughness Ra of 50 nm or less, and a shape recovery of a distortion angle of 10° or less after being wound around a 30 mm diameter cylinder.
(2) Stainless steel foil for flexible display use as set forth in (1) characterized in that said stainless steel foil has a 0.2% yield strength of at least 600N/mm$^2$.
(3) Stainless steel foil for flexible display use as set forth in (1) or (2) characterized in that said stainless steel is ferritic stainless steel.

Advantageous Effects of Invention

According to the stainless steel foil of the present invention, when used as a TFT substrate for a flexible display, it is possible to form good TFTs and possible to obtain a flexible display easy to return to its original shape after being rolled up or bent.

EMBODIMENTS OF INVENTION

As properties required by a flexible display, the display has to be able to be repeatedly rolled up into a tubular shape of a diameter of about 50 mm able to be held by one hand and has to be able to withstand repeated bending by the average radius of curvature of when turning a page of a book. These become indicators of flexibility. The inventors investigated, as a parameter of such flexibility, to what extent stainless steel foil can return to its original shape after bending SUS stainless steel foil along various diameters of cylindrical mandrels and then releasing the bending force.

As a result, they learned that if the diameter of the mandrel is large, the original shape is more easily returned to, so with a 40 mm or larger diameter mandrel, it is difficult to rank the shape recovery of thin stainless steel foil. Further, in tests of a thin mandrel of a diameter of 20 mm or less, considerably severe stress is applied compared with that envisioned in actual application. With any SUS foil, the shape becomes hard to recover, therefore it was difficult to determine the effects of the grade and thickness of the stainless steel foil.

Figure 2:
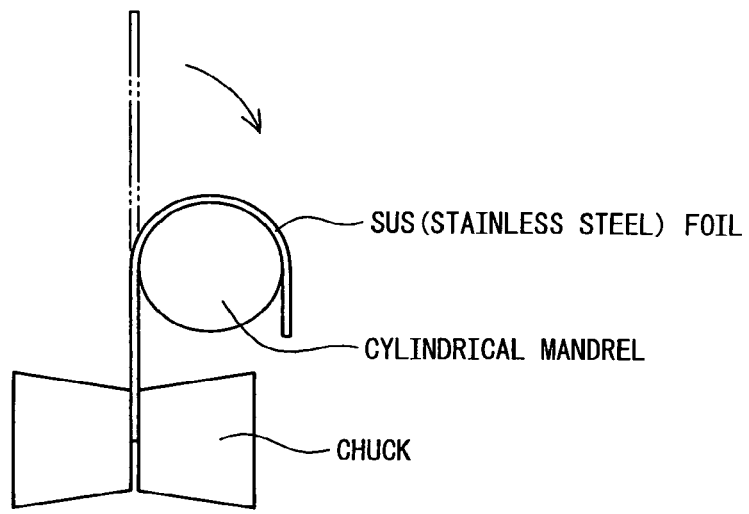
FIG. 2 is a view showing a method of evaluation of the flexibility of stainless steel foil in the present invention.
Figure 3:
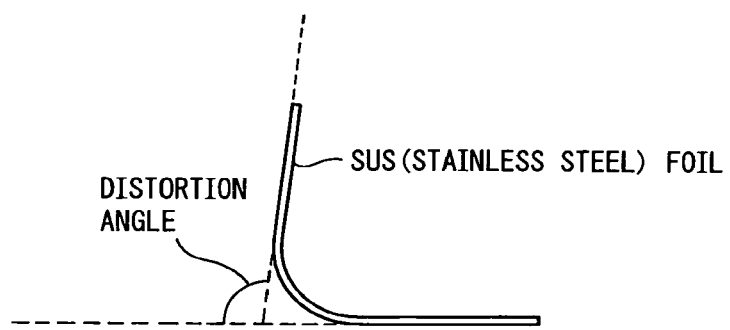
FIG. 3 is a view showing the definition of the distortion angle used as a parameter for evaluation of the flexibility of stainless steel foil in the present invention.

The inventors defined, as the flexibility required for a display, as shown in FIG. 2, the "distortion angle) (°)" from the degree of bending of stainless steel foil after fastening one longitudinal direction end of a substantially rectangular piece of stainless steel foil to a chuck, applying force to bend the other end around a 30 mm diameter cylindrical mandrel by 180°, then removing the force. That is, as shown in FIG. 3, they defined the angle formed between the other end and the flat surface when fastening one longitudinal end of a rectangular shape to a flat surface as the distortion angle (°). Further, they discovered that as the required flexibility, this distortion angle has to be a small distortion angle of 10° or less. When the distortion angle is 180°, it means the shape is not returned to at all, while when 0°, it means a flat surface is returned to. When this distortion angle is larger than 10°, when used as a flexible display, the problems of creasing and inability to return to the original shape arise. Therefore, the smaller the distortion angle the better.

The thickness of the stainless steel foil is 20 μm to 200 μm, more preferably 60 μm to 150 μm. If the stainless steel foil is thinner than 20 μm, it easily creases or wrinkles and handling of the foil becomes impractical, while if over 200 μm, it becomes too heavy when used for a flexible display and also loses flexibility.

Figure 1:
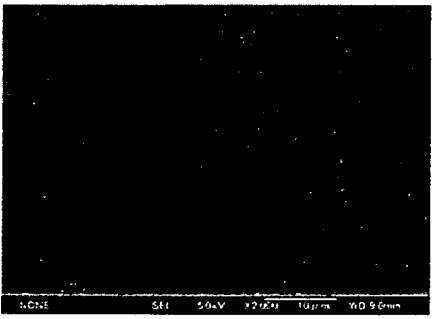
FIG. 1 gives SEM photographs of the surfaces of SUS430H and SUS430BA stainless steel foils and the surfaces after formation of 1.7 μm siloxane-based insulating films on the same.
Figure 1:
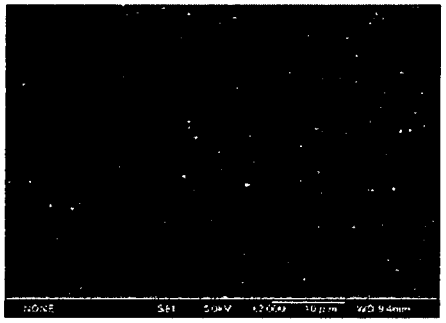
Figure 1:
Figure 1:
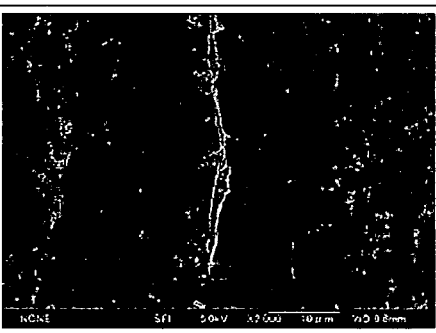

The surface roughness of the stainless steel foil was, in terms of Ra, 50 nm or less, preferably 25 nm or less. The surface of the stainless steel foil, as shown in FIG. 1, has 10 μm or so bald spots, ridging, etc., so when using AFM etc. to measure a narrow region for roughness, the results will greatly differ depending on the measurement location. The surface roughness Ra in the present invention was determined by measuring a scan length of 1.25 mm by a stylus type roughness meter in the foil rolling direction and a direction vertical to the rolling direction in two locations each and averaging the results of the total four measurements. If the surface roughness Ra of stainless steel foil exceeds 50 nm, the Ra of the surface of the insulating film after formation of the insulating film becomes larger and therefore short-circuits occur between interconnects of the TFTs.

Further, the stainless steel foil of the present invention is not particularly limited in its yield strength, but the 0.2% yield strength of stainless steel foil is preferably at least 600N/mm$^2$. The "0.2% yield strength" is the stress causing 0.2% plastic strain when removing the load in a tensile test of most metal materials not exhibiting a yield phenomenon. When the 0.2% yield strength is lower than 600N/mm$^2$, if the thickness of the stainless steel foil becomes greater, the distortion angle tends to easily become larger. The higher the yield strength, the better, but in the case of stainless steel, 1600 to 1700N/mm$^2$ is the upper limit generally known in terms of material characteristics.

Further, the stainless steel foil of the present invention is not particularly limited in the type of the stainless steel, but the stainless steel foil is preferably ferritic stainless steel. That is, when trying to form TFTs on insulated stainless steel foil, the insulating film easily cracks or peels due to the difference in heat expansion coefficients between the insulating film and stainless steel foil. Stainless steel is roughly classified as austenitic and ferritic, but ferritic stainless steel has a heat expansion coefficient of two-thirds that of austenitic steel or about $11 \times 10^{-6}/°$ C. This has the effect of suppression of cracks in the insulating film. From such a viewpoint, ferritic stainless steel is preferable.

The stainless steel foil with good shape recovery of the present invention is obtained by using an ordinary method to smelt stainless steel having various compositions, cast it into slabs, and heat and hot roll it to obtain hot rolled steel sheet. This hot rolled steel sheet is then, if necessary, annealed and then rolled by cold rolling and foil rolling. The stainless steel foil with good shape recovery of the present invention can be produced by just the process of cold rolling and foil rolling without bright annealing (BA). A hard (H) material which is not bright annealed is work hardened. It has a high springiness, so shape recovery is easy. If comparing the same type of steel between a BA material which has been bright annealed and an H material which has not been bright annealed for the 0.2% yield strength, in the case of SUS304, a BA material has a value of about 400N/mm$^2$, while an H material has a value of about 1000N/mm$^2$. For SUS430, a BA material has a 0.2% yield strength of 300N/mm$^2$, while an H material has a value of 800N/mm$^2$. In this way, with an H material which is not bright annealed, a high shape recovery can be expected. However, since the material is not bright annealed, which contributes to a mirror finish, the smoothness of the surface is inferior. To obtain a smoothness of an Ra of 50 nm or less, polishing is necessary. For polishing, buffing is optimal. Use of fine buffing enables a mirror surface to be obtained.

Polishing takes time and money, it is possible to use the method of superbright (SB) finishing using highly flat rolls lapped to #1000 or finer in the final pass of foil rolling for rolling by a high reduction rate so as to obtain a finish close to a mirror finish without bright annealing. This method is effective for SUS304 or other austenitic stainless steel. On the other hand, ferritic stainless steel is softer compared with austenitic steel in terms of crystal structure, so even if trying to roll it by a high reduction rate as explained above, the rolls end up biting into the metal and therefore obtaining a smooth surface by rolling by a high reduction rate is extremely difficult. However, by securing a total reduction rate of 70% or more and a reduction at each pass of 20% or more by 20 to 200 μm foil rolling, more preferably 50 to 150 μm foil rolling and using superhard rolls polished by #1000 or finer abrasives at the pass right before the final one and the final pass for rolling by a rolling rate of 50 m/min or less, it is possible to obtain a surface with a good smoothness without bright annealing.

As the ferritic stainless steel, in addition to SUS430, it is possible to use SUS430J1L or other high purity ferrite reduced in C and N concentrations. With usual SUS430, only [C]≤0.12% is defined, but with high purity ferrite, [C]≤0.025% and [N]≤0.025%. In particular, a material with a range of composition of [C]≤0.015%, [Si]≤0.50%, [Mn]≤0.50%, [P]≤0.04%, [S]≤0.03%, 18.00%≤[Cr]≤20.0%, 1.75%≤[Mo]≤2.25%, [N]≤0.011%, and [Ti]+[Nb]≥16([C]+[N]) (NSSC190) has a worse crystal orientation than SUS430 or SUS430JIL, so the stripe pattern in the rolling direction called "ridging" is reduced and a surface extremely superior in smoothness (SB finish) is obtained. Here, [C], [N], [Si], [Mn], [P], [S], [Cr], [Mo], [Ti], and [Nb] indicate the concentrations in the steel of the carbon, nitrogen, silicon, manganese, phosphorus, sulfur, chromium, molybdenum, titanium, and niobium in units of mass %.

As explained above, from the viewpoint of securing high shape recovery, to secure a certain high yield strength, an H material which is not bright annealed is used. On the other hand, for a BA material of stainless steel foil which is bright annealed, since the yield strength is low, it is possible to reduce the distortion angle and obtain an improved surface smoothness only in 60 μm or less thin foil.

The stainless steel foil of the present invention is coated with an insulator for use as a TFT substrate. As the material for the insulation coating, a polyamide or other high heat resistance organic resin or siloxane-based resin may be mentioned. As the coating method, dip coating, spray coating, spin coating, slit coating, etc. may be mentioned. The greater the thickness of the insulating film, the more effective for smoothening, but the greater the thickness, the easier the inadvertent peeling in the TFT fabrication process, so a coating of about 1.5 to 3.0 μm is general practice.

EXAMPLES

In the examples and comparative examples shown in Table 1, various types of stainless steel foil differing in sheet thickness, finish, polishing, surface roughness, etc. were cut into 370 mm×470 mm pieces (stainless steel foil) for use as test pieces for investigation of their properties.

Note that, "SUS" indicates the type of stainless steel according to the JIS standard (JIS G4305), while "NSSC190" indicates a type of stainless steel based on the in-house standards of the applicant and having a composition comprising, by mass %, C≤0.015%, Si≤0.50%, Mn≤0.50%, P≤0.040%, S≤0.030%, Cr18.00-20.00%, Mo1.75-2.25%, N≤0.015%, Nb %+Ti %≥16(C %+N %).

Note that, in the "finish" column, "H-SB" indicates a not bright annealed hard material which is made high in smoothness by high reduction rate rolling (SB finish). "H" means an ordinary hard material. "BA" means a bright annealed material. The "buffing" column shows whether fine buffing is used to give a mirror finish.

The "surface roughness Ra" shows the results of measurement of the surface of the stainless steel foil itself and the surface after formation of the insulating film by AFM for a 15 μm square area. Note that, the insulating film was formed by using a slit coater to coat the stainless steel foil with a siloxane-based insulating film and heat treating this in an oven to form an insulating film of a thickness of 1.7 μm.

The distortion angle, as shown in FIG. 2, is the angle found by bending clean stainless steel foil with no insulating film by 180° along a 30 mm diameter cylindrical mandrel, removing the force, then examining the degree of bending of the SUS foil. The distortion angle is defined as shown in FIG. 3.

As the yield strength, the 0.2% yield strength for clean stainless steel foil with no insulating film is shown.

The properties of the TFTs were evaluated as follows: A test piece of stainless steel foil was formed with an insulating film, then SiO$_2$ film was formed by CVD to 0.3 μm, and gate electrodes, a gate insulating layer, and polycrystalline silicon layer were formed. For forming the polycrystalline silicon layer, annealing was performed at 350° C. After that, source electrodes and drain electrodes were formed so as to prepare 100 TFTs in a 50 μm×5 μm size. The properties of the TFTs formed in 370 mm×470 mm of stainless steel foil were investigated. The case of no short-circuits between interconnects due to surface relief is indicated as "VG" (very good), the case of two or less short-circuits as "G" (good), and the case of more as "P" (poor). Further, the case of no TFT defects due to cracks is indicated as "VG" (very good), the case of two or less defects as "G" (good), and the case of more as "P" (poor).

Further, to evaluate the flexibility, the stainless steel foil was rolled up into a tube of a diameter of 50 mm and unrolled repeatedly 100 times, then the flatness of the stainless steel foil was investigated. The stainless steel foil after the above repeated rolling operations was placed on a flat surface. The case of a rise at the ends of 10 mm or less is indicated as "VG" (very good), the case of 25 mm or less as "G" (good), and other cases as "P" (poor).

Regarding the handling, for 370 mm×470 mm stainless steel foil, the case of the ability of the stainless steel foil to be handled by itself is indicated as "VG" (very good), the case of no creases if handled together with a support as "G" (good), and the case of creases in the process of fastening to a support or removal from a support as "P" (poor).

TABLE 1

| | Steel type | Finish | Buffing | Thickness (μm) | Ra (nm) SUS | Ra (nm) Insulating film | Distortion angle (°) | 0.2% yield strength (N/mm²) | TFT defects Due to surface relief | TFT defects Cracks | Flatness after repeated rolling into tubular shape | Handling |
|---|---|---|---|---|---|---|---|---|---|---|---|---|
| Ex. 1 | NSSC190 | H-SB | No | 22 | 15 | 10 | 0 | 800 | VG | VG | VG | G |
| Ex. 2 | NSSC190 | H-SB | No | 80 | 15 | 10 | 2 | 800 | VG | VG | VG | VG |
| Ex. 3 | NSSC190 | H-SB | No | 195 | 15 | 10 | 9 | 800 | VG | VG | G | VG |
| Ex. 4 | SUS430J1L | H-SB | No | 65 | 22 | 10 | 2 | 820 | VG | VG | VG | VG |
| Ex. 5 | SUS444 | H | Yes | 100 | 10 | 5 | 2 | 800 | VG | VG | VG | VG |
| Ex. 6 | SUS430 | H | Yes | 180 | 8 | 5 | 9 | 785 | VG | VG | G | VG |
| Ex. 7 | SUS430 | H | Yes | 45 | 8 | 5 | 0 | 785 | VG | VG | VG | VG |
| Ex. 8 | SUS304 | H-SB | No | 125 | 40 | 18 | 5 | 980 | VG | G | VG | VG |
| Ex. 9 | SUS304 | H-SB | No | 140 | 40 | 18 | 6 | 980 | VG | G | VG | VG |
| Ex. 10 | SUS304 | BA | No | 55 | 13 | 6 | 9 | 390 | VG | G | VG | G |
| Ex. 11 | SUS430 | BA | No | 40 | 14 | 6 | 8 | 295 | VG | VG | G | G |
| Comp. Ex. 1 | SUS430 | BA | No | 100 | 14 | 6 | 78 | 295 | VG | VG | P | VG |
| Comp. Ex. 2 | SUS304 | BA | No | 65 | 13 | 6 | 22 | 390 | VG | G | P | VG |
| Comp. Ex. 3 | NSSC190 | H-SB | No | 18 | 15 | 10 | 0 | 800 | G | VG | VG | P |
| Comp. Ex. 4 | NSSC190 | H-SB | No | 210 | 15 | 10 | 12 | 800 | G | VG | P | VG |
| Comp. Ex. 5 | SUS430 | H | No | 60 | 75 | 39 | 2 | 785 | P | VG | VG | VG |

As shown in Table 1, the stainless steel foils of Examples 1 to 11 of the present invention had suitable thicknesses, had distortion angles of 10° or less and therefore were superior in shape recovery, and were small in surface roughness and good in smoothness. TFTs fabricated using these were extremely small in number of defects.

As opposed to this, the stainless steel foils of Comparative Example 1 and Comparative Example 2 both had relatively small yield strengths and large thicknesses as BA materials, therefore were large in distortion angle and were inferior in shape recovery and flatness. The stainless steel foil of Comparative Example 3 had too small a thickness of foil and was inferior in handling, the stainless steel foil of Comparative Example 4 had too large a thickness of foil and had a large distortion angle and insufficient shape recovery, while the stainless steel foil of Comparative Example 5 had a large surface roughness and had defects due to relief shapes as TFTs.

INDUSTRIAL APPLICABILITY

The stainless steel foil of the present invention is superior in shape recovery after being rolled up and bent and is high in surface smoothness, so can be used as the substrates for thin liquid crystal displays, flexible display, organic EL displays, electronic paper, etc.

The invention claimed is:

1. A method for producing a stainless steel foil for flexible display use having a thickness of 20 μm to 200 μm, a surface roughness Ra of 50 nm or less and a shape recovery of a distortion angle of 10° or less after being wound around a 30 mm diameter cylinder, comprising applying superbright finishing to a stainless steel sheet without bright annealing, wherein said superbright finishing comprises foil-rolling the stainless steel sheet using flat rolls lapped with #1000 or finer abrasive in at least a final pass of foil rolling.

2. The method for producing a stainless steel foil for flexible display use as set forth in claim 1, wherein said superbright finishing comprises foil-rolling the stainless steel sheet to 20 to 200 μm with a total reduction of 70% or more and a reduction at each pass of 20% or more, using superhard rolls lapped with #1000 or finer abrasive, at a rolling rate of 50 m/min or less in the pass right before the final one and the final pass.

3. The method for producing a stainless steel foil for flexible display use as set forth in claim 1 or 2, wherein the stainless steel foil has 0.2% yield strength of at least 600N/mm².

4. The method for producing a stainless steel foil for flexible display use as set forth in claim 1 or 2, wherein the stainless steel foil is ferritic stainless steel.

5. The method for producing a stainless steel foil for flexible display use as set forth in claim 3, wherein the stainless steel foil is ferritic stainless steel.

* * * * *

UNITED STATES PATENT AND TRADEMARK OFFICE
CERTIFICATE OF CORRECTION

PATENT NO. : 8,961,717 B2  Page 1 of 1
APPLICATION NO. : 14/193042
DATED : February 24, 2015
INVENTOR(S) : Noriko Yamada et al.

It is certified that error appears in the above-identified patent and that said Letters Patent is hereby corrected as shown below:

Specification

Column 4, line 2, change "the "distortion angle) (°)"" to -- the "distortion angle (°)" --.

Signed and Sealed this
Twenty-fourth Day of November, 2015

Michelle K. Lee
*Director of the United States Patent and Trademark Office*